United States Patent [19]

Dabbish et al.

[11] Patent Number: 5,090,015
[45] Date of Patent: Feb. 18, 1992

[54] PROGRAMMABLE ARRAY LOGIC SELF-CHECKING SYSTEM

[75] Inventors: Ezzat A. Dabbish, Buffalo Grove; Larry C. Puhl, Sleepy Hollow; William L. Brendle, Carol Stream, all of Ill.

[73] Assignee: Motorola, Inc., Schaumburg, Ill.

[21] Appl. No.: 306,955

[22] Filed: Feb. 6, 1989

[51] Int. Cl.$^5$ ............................................. G01R 31/28
[52] U.S. Cl. .................................... 371/22.5; 371/22.4
[58] Field of Search .................... 371/3, 16.1, 19, 22.1, 371/22.2, 22.4, 22.5, 22.6, 25.1, 27, 37.1, 40.1; 365/185, 201

[56] References Cited

U.S. PATENT DOCUMENTS

| | | | |
|---|---|---|---|
| 4,124,899 | 11/1978 | Birkner et al. | 307/465 |
| 4,811,078 | 3/1989 | Tigelaar et al. | 357/54 |
| 4,879,688 | 11/1989 | Turner et al. | 371/22.2 X |

OTHER PUBLICATIONS

Nuez, J. et al., "Self-Test on a Read-Only Memory", IBM Technical Disclosure Bulletin, vol. 27, No. 9, Feb. 1985, p. 5338.
Millman, J. et al., *Microelectronics*, McGraw-Hill, 1987, pp. 301-308.

*Primary Examiner*—Stephen M. Baker
*Attorney, Agent, or Firm*—Timothy W. Markison; Steven G. Parmelee; Joseph P. Krause

[57] ABSTRACT

A self checking electronically erasable programmable array logic (EEPAL) that comprises an input receiver, a programmable array, an error detection code storage array, an error detection circuitry, and error signalling circuitry is disclosed. The self checking EEPAL verifies the storage integrity of each cell within the programmable array during the programming of the EEPAL, after completion of programming the EEPAL, and prior to executing the algorithm stored in the EEPAL.

19 Claims, 3 Drawing Sheets

TABLE 1

| VARIABLE STATE | FUSE MAP ASSIGNMENT |
|---|---|
| T = TRUE | 01 |
| F = FALSE | 10 |
| X = DON'T CARE | 11 |
| | 00 (NOT ALLOWED) |

TABLE 2

| NODE NAME | MODES OF OPERATION | | | |
|---|---|---|---|---|
| | ERASE | PROGRAM | VERIFY | READ |
| PTL | 0V | 20V/5V | 5V/0V | PRECHARGE |
| SG | 5V | 20V/5V | PRECHARGE | 5V/0V |
| CG | 20V | 0V | 0V | 0V |
| EEGND | 0V | 5V | 0V | 0V |

LOGIC 0 = 0V
LOW VOLTAGE
  LOGIC 1 = 5V
HIGH VOLTAGE
  LOGIC 1 = 20V

PROGRAMMABLE ARRAY LOGIC SELF-CHECKING SYSTEM

TECHNICAL FIELD

Programmable array logic (PAL) devices are used in digital cryptographic circuits for storing an encryption algorithm. In such circuits the accuracy of the stored encryption algorithm is critical and must be verified. This invention provides a technique for verifying the integrity of the encryption algorithm by self-checking it during programming, after completion of programming and prior to execution.

BACKGROUND OF THE ART

The use of programmable array logic (PAL) devices to implement logic functions is well known in the art. External programming equipment programs the PAL with a fuse map representing the desired logic functions. Upon completion of programming, the external programming equipment verifies the storage integrity of the PAL by inputting known data (test vectors) and testing the resulting output. If the resulting output is the anticipated output, the stored fuse map is assumed to be accurate.

The storage integrity of a PAL that stores a fuse map representing a security sensitive encryption algorithm must be completely verified immediately after programming and prior to execution. To completely verify the storage integrity of a PAL, test vectors have at least two problems. First, a test vector needs to be generated for each input combination, thus a long test cycle is required. (For a 16-input PAL, the external programming equipment would have to generate $2^{16}$ (65,536) test vectors for each output.) Second, during normal in-field operation, the external programming equipment is usually not available, making the storage integrity of the PAL difficult to test. If the test vectors are stored with in the same circuitry as the PAL is employed, security sensitive information could be inferred from the storage of the test vectors.

Therefore, a need exists for a PAL verification system which can reasonably and completely verify the stored fuse map during programming, after completion of programming and prior to execution without revealing security sensitive information.

SUMMARY OF THE INVENTION

This need is substantially met by the programmable array logic (PAL) self-checking system disclosed herein. The disclosed PAL self-checking system comprises an input register, a programmable array, a fixed array, an error detection register, an error detection circuit and an error detection signal. Polynomial coefficients representing an encryption algorithm and an error detection code generated from the polynomial are stored in the programmable array. The storage integrity of the polynomial coefficients is verified by the PAL self-checking system during the programming phase, immediately after completing the programming phase and prior to execution.

In one embodiment, external programming equipment programs the programmable array, row-by-row, with polynomial coefficients representing the encryption algorithm and an error detection code calculated from the polynomial. As each row is programmed, the stored polynomial coefficients are compared with the entered polynomial coefficients to verify they were accurately stored. The row-by-row programming and verification process is repeated until all the polynomial coefficients and the error detection code are accurately stored in the programmable array. Immediately following the programming cycle and prior to execution, the error detection circuit verifies the integrity of the encryption algorithm by using the error detection code. In an error is detected at any phase of operation, an error signal is generated and the PAL is disabled.

Table 1 comprises a fuse map conversion chart.

Table 2 comprises a bias voltage chart for the EEP cells mode of operation.

BEST MODE FOR CARRYING OUT THE INVENTION

Figure 1:
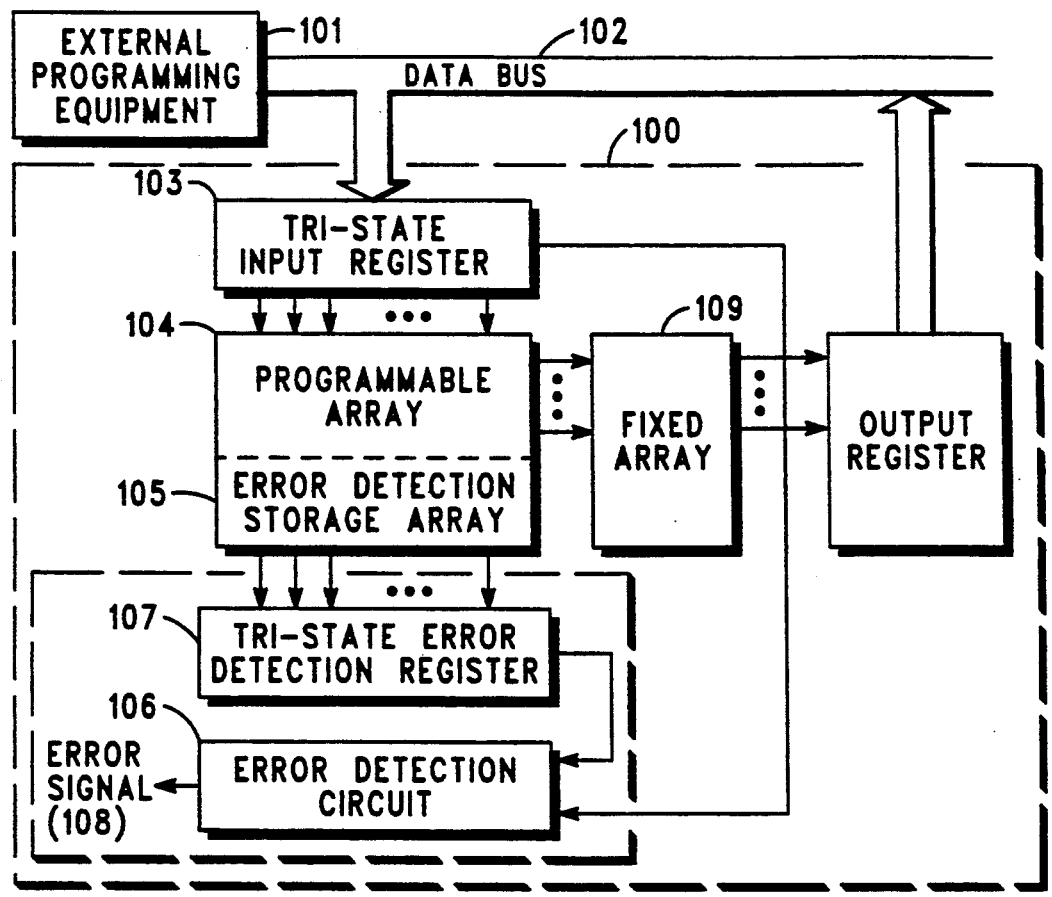
FIG. 1 is a block diagram of a programmable array logic (PAL) device which incorporates the PAL self-checking system.

FIG. 1 illustrates a programmable array logic (PAL) device incorporating the PAL self-checking system (100). The external programming equipment (101) programs the PAL (100), via a data bus (102), with polynomial coefficients representing the logic functions of an encryption algorithm and an error detection code generated from the polynomial. The PAL (100) receives the programming data in a tri-state input register (103). the PAL (100) then stores the polynomial coefficients in a programmable array (104) and stores the error detection code in an error detection storage array (105). The error detection storage array (105) may be contained within the programmable array (104), isolated from a fixed array (109), and connected to a tri-state error detection register (107) which is in a high impedance state during the programming phase.

After a row of the programmable array (104) is programmed with polynomial coefficients, its storage integrity is verified. The PAL (100) places the tri-state input register (103) in a high impedance state and the tri-state error detection register (107) in an active state. Then the tri-state error detection register (107) reads and stores the contents of the row. Next, the tri-state error detection register (107) and the tri-state input register (103) simultaneously shift their contents into the error detection circuit (106). The error detection circuit (106) compares the two data streams to verify the contents of the row. If the error detection circuit (106) detects an error, it generates an error signal (108). The programming of the error detection storage array (105) is verified similarly.

Upon completion of programming, the PAL (100) automatically activates the self-checking process by calculating an integrity code from the stored polynomial coefficients. Then the error detection circuit (106) verifies the integrity of the stored polynomial coefficients by comparing the integrity code with the error detection code stored in the error detection storage array (105). If the error detection circuit (106) detects an error, it generates an error signal (108) and disables the PAL (100), otherwise, the PAL (100) is ready for normal operation.

During normal operation, the PAL (100) is capable of self-checking the stored polynomial coefficients prior to every execution. The PAL (100) automatically calculates an integrity code from the stored polynomial coefficients. The error detection circuit (106) verifies the integrity of the stored polynomial coefficients by comparing the integrity code with the error detection code stored in the error detection storage array (105). If the error detection circuit (106) detects a storage error, it generates an error signal (108) and disables the PAL (100), otherwise, the PAL (100) executes the program.

Figure 2:
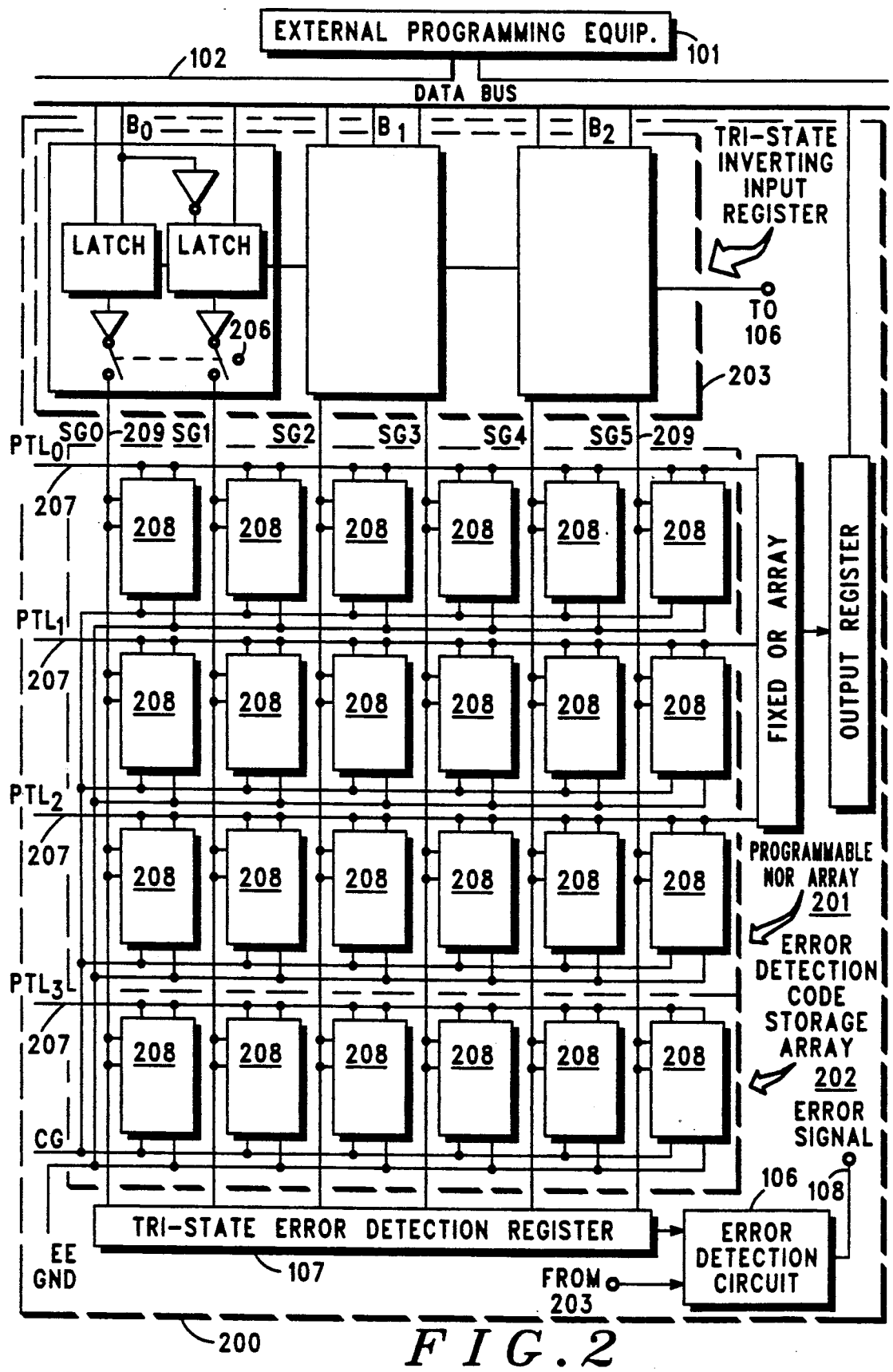
FIG. 2 is a block diagram of an electrically erasable/programmable array logic (EEPAL) with a detailed view of the programmable array.

FIG. 2 illustrates a block diagram of a three input, single output electrically erasable/programmable array logic (EEPAL) device incorporating the PAL self-checking system (200). Note that the disclosed PAL self-checking system is better suited for a large EEPAL consisting of n-inputs and x-outputs; however, for the sake of clarity, the operation of a small EEPAL such as the one depicted by FIG. 2 will be discussed.

The explanation presumes provision of an encryption algorithm which performs the function $f1 = B0B1^*B2 + B0^*B1B2 + B0B1$. By using a fuse map assignment, as shown in Table 1, a polynomial A(x) is calculated, such that $A(x) = x^{16} + x^{15} + x^{12} + x^{11} + x^8 + x^6 + x^4 + x^2 + x + 1$. For a cyclic redundancy check (CRC) method, the error detection code is a polynomial V(x) generated from A(x).

The external programming equipment (101) programs the EEPAL (200) with the coefficients of the polynomial A(x) (Z(x) coefficients) and the coefficients of the CRC polynomial V(x) (CRC coefficients). The EEPAL (200) latches the first product term coefficients into an inverting tri-state input register (203). Next, the EEPAL (200) addresses a programmable NOR array (201) by selecting a product term line (207), closing all tri-state input register gatable switches (206), and placing the tri-state error detection register (107) in a high impedance state. The programmable NOR array (201) receives the data via select gate (SG) lines (209) and stores it in the selected row of electrically erasable/programmable and verifiable (EEPV) cells (208). (The EEPV cell (208) will be discussed below.) After storing the A(x) coefficients, the EEPAL (200) verifies their integrity.

The EEPAL (200) tests the storage integrity of the selected row by: first, the EEPAL (200) opens all the tri-state input register gatable switches (206) and places the tri-state error detection register (107) in an active state; second, the tri-state error detection register (107) reads and stores the data stored in the selected row; third, the tri-state error detection register (107) and the inverting tri-state input register (203) simultaneously shift their contents into the error detection circuit (106); fourth, the error detection circuit (106) compares the two data streams to verify the storage integrity of the row; and finally, the error detection circuit (106) generates an error signal (108) if an error is detected. The storing and verifying process repeats until all the A(x) coefficients are accurately stored in the programmable NOR array (201).

The storing and verifying of the CRC coefficients is similar to the storing and verifying of the A(x) coefficients. The EEPAL (200) latches the CRC coefficients into the inverting tri-state input register (203). Next, the EEPAL (200) addresses an error detection code storage array (202) by selecting its product term line (207), closes all tri-state input register gatable switches (206) and places the tri-state error detection register (107) in a high impedance state. The error detection code storage array (202) receives the data via select gate (SG) lines (209) and stores it in the addressed row of EEPV cells (208). After storing the CRC coefficients, the EEPAL (200) verifies the storage integrity of the CRC coefficients as it did for the A(x) coefficients.

With the programming process completed, the EEPAL (200) automatically activates the self-checking process by calculating an integrity code from the stored coefficients. Then the error detection circuit (106) verifies the integrity of the stored coefficients by comparing the integrity code with CRC coefficients stored in the error detection code storage array (202). If the error detection circuit (106) detects an error, it generates an error signal (108) and disables the EEPAL (200), otherwise, the EEPAL (200) is ready for normal operation.

During normal operation the EEPAL (200) is capable of self-checking the integrity of the stored coefficients before every execution. For the self-checking process, the EEPAL (200) automatically calculates an integrity code from the stored coefficients. The error detection circuit (106) verifies the integrity of the stored coefficients by comparing the integrity code with the CRC coefficients stored in the error detection code storage array (202). If the error detection circuit (106) detects a storage error, it generates an error signal (108) and disables the EEPAL (200), otherwise, the EEPAL (200) executes the program.

Figure 3:
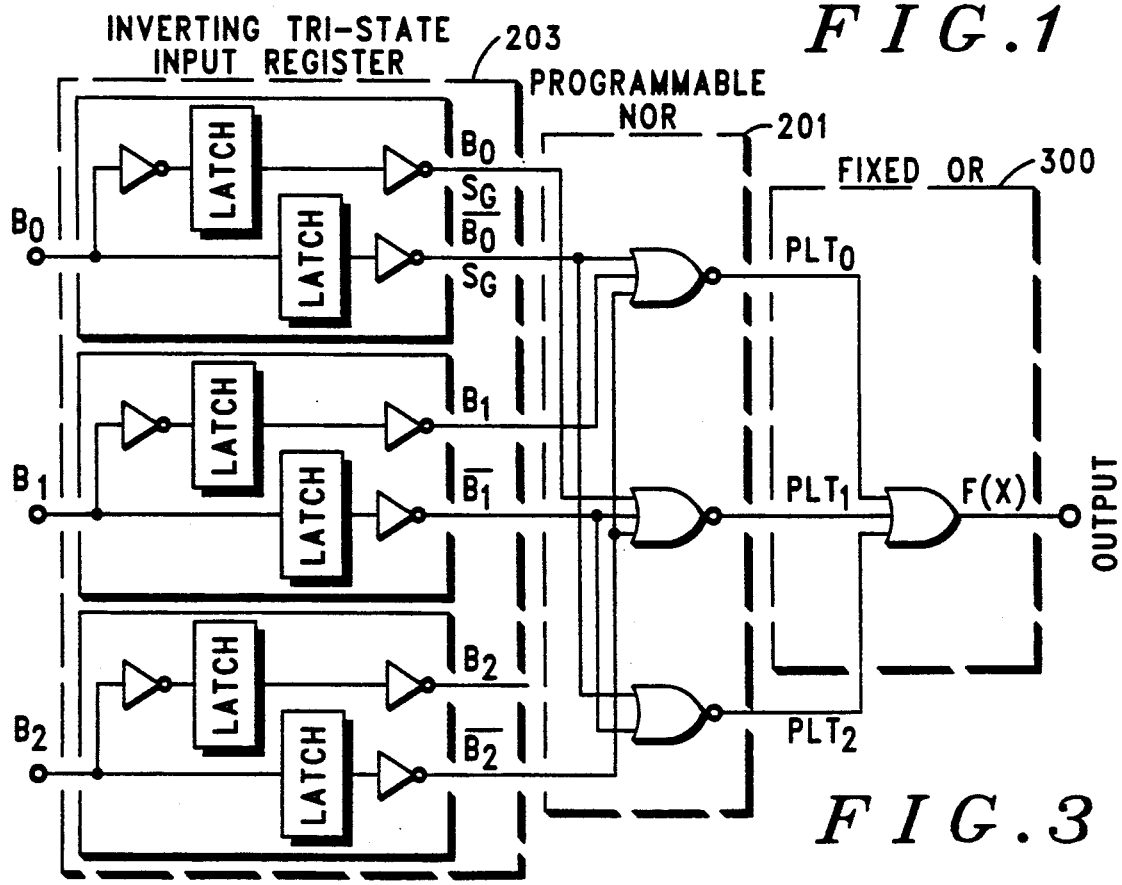
FIG. 3 is a schematical representation of the algorithm programmed into the EEPAL of FIG. 2.

FIG. 3 is a schematic of the programmed EEPAL (200). The EEPAL (200) executes the program by: latching data into the inverting tri-state input register (203); transferring it to the programmable NOR array (201); and generating an output from the function represented by the programmable NOR array (201) and a fixed OR array (300).

Figure 4:
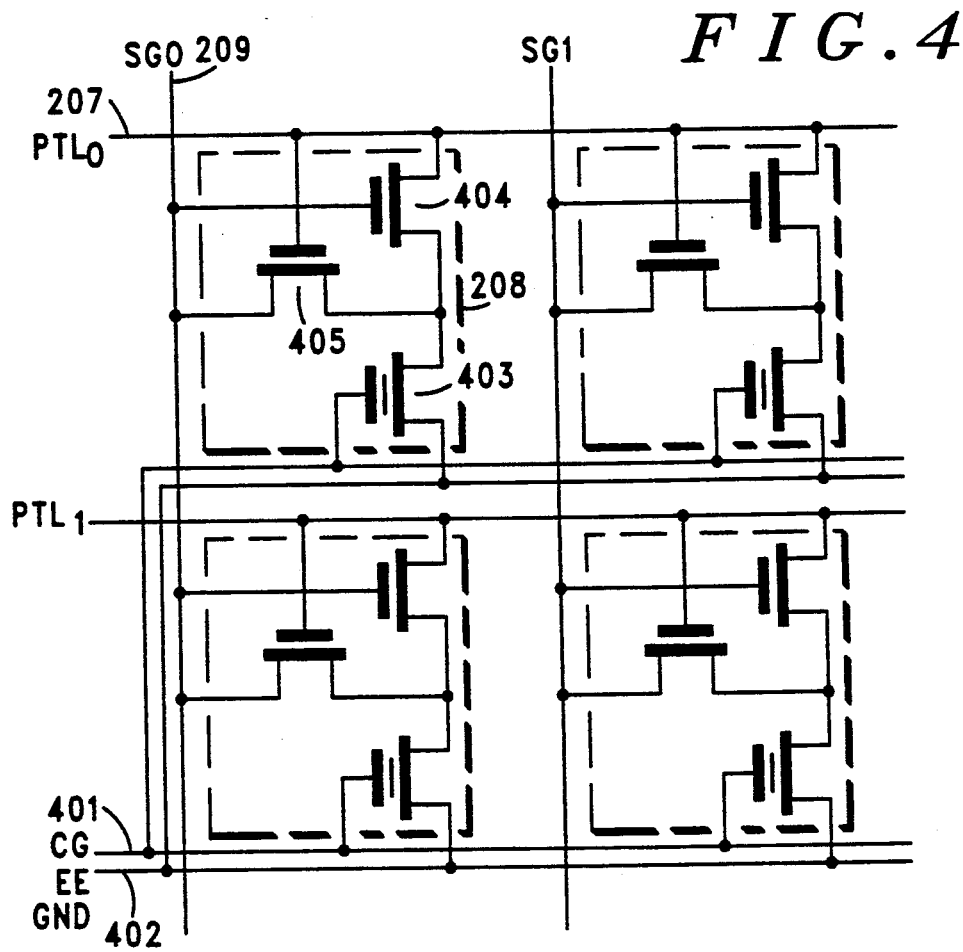
FIG. 4 shows four electrically erasable/programmable (EEP) cells of the EEPAL illustrated in FIG. 2.

FIG. 4 depicts four electrically erasable/programmable and verifiable (EEPV) cells (208) electrically connected together to form a section of the programmable NOR array (201). EEPV cells (208) of a row are connected together by a product term line (207), EEPV cells (208) of a column are connected together by a select gate (SG) line (209) and all EEPV cells (208) are connected together by a control gate (CG) line (401) and a return line (EEgnd) (402). The EEPV cell (208) comprises an electrically erasable/programmable device (403) electrically connected to a selection device (404) and a verification device (405). For this example the verification device (405) and the selection device (404) are metal-oxide-semiconductor field effect transistors.

The EEPV cells (208) are electrically programmable, erasable, readable and verifiable. Table 2 illustrates typical bias voltages required for each state. In the erase mode, all the PT lines (207) and EEgnd lines (402) are biased with a logic 0, all the SG lines (209) are biased with a low voltage 1 and all the CG lines (401) are biased with a high voltage logic 1. With the present biasing, the EEP device (403) develops a negative potential on its floating gate, thus turning it off. By turning off the EEP device (403), the EEPV cell (208) is erased.

In the program mode, all the EEPV cells (208) in both the programmable NOR array (201) and the error detection code storage array (202) are initially erased or set to a logic 0 state. A row is then addressed by biasing its product term (PT) line (207) to a high voltage logic 1, biasing the CG line (401) to a logic 0, and biasing the EEgnd line (402) to a low voltage logic 1, Finally, the A(x) coefficients, or the CRC coefficients, are programmed into the EEPV cells (208) of the addressed row. To program a logic 1 into the EEPV cell (208), the EEP device (403) must be turned on. The EEP device (403) is turned on by biasing the SG line (209) to a high voltage logic 1 and biasing the other lines as mentioned above. To insure that only the addressed row is programmed, all other product term lines (207) are biased to a low voltage logic 1 or a logic 0.

To verify the data stored in a row of EEPV cells (208), the row's PT line (207) is biased with a low voltage logic 1 and all other PT lines are biased with a logic 0. The CG (401) and EEgnd (402) lines are biased with a logic 0 and the SG lines (209) are biased with a high impedance pre-charge low voltage logic 1. If the EEPV cell (208) contains a logic 0, the EEP device (403) is off and the SG line (209) remains at the pre-charge low voltage logic 1 state. If the EEPV cell (208) contains a logic 1, the EEP device (403) is on and pulls down the pre-charged SG line (209) to a logic 0. The tri-state error detection register (107) reads the SG lines (209) and shifts the data to the error detection circuit (106) wherein the contents of the EEPV cells (208) are verified.

In the read, or normal, mode all PT lines (207) are preliminary biased with a high impedance pre-charge low voltage logic 1, and all the CG (401), SG (409) and EEgnd (402) lines are biased to a logic 0. To read data, the pre-charge bias is removed from the PT lines (207) and the inverting tri-state input register (203) is activated. If the input on an SG line (209) is a logic 0, regardless of whether the EEP device (403) is on or off, the PT line (207) is not affected by the EEPV cell (208) because the select device (404) is off. If the input on an SG line (209) is a low voltage logic 1, then the select switch is turned on. If the EEPV cell (208) contains a logic 0, the EEP device (403) is off and the PT line (207) remains at the pre-charged low voltage logic 1 state. If the EEPV cell (208) contains a logic 1, the EEP device (403) is on and pulls down the pre-charged PT line (207) to a logic 0.

What is claimed is:

1. A self checking electronic erasable programmable array logic (EEPAL) comprising:
   input means for receiving an algorithm, a predetermined error detection code and data;
   programmable array means coupled to the input means for storing and executing the algorithm;
   error detection code storage means coupled to the programmable array means for storing the predetermined error detection code;
   error detection means coupled to the programmable array means and to the error detection code storage means for detecting programming and storage errors of the programmable array means and for detecting programming and storage errors of the error detection storage means during programming, after completion of programming, and prior to execution of the algorithm; and
   error signal means coupled to the error detection means for signaling an error.

2. The self-checking EEPAL of claim 1 wherein the programmable array means is programmable to selectively store, erase, verify and read data.

3. The self-checking EEPAL of claim 2 wherein the error detection means comprises a tri-state error detection register electrically coupled to an error detection circuit such that the input means is in a high impedance state and the tri-state error detection register is in an active state when a representation of the algorithm stored in the programmable array means is being verified, and the tri-state error detection register is in a high impedance state and the tri-state input means is in an active state when the programmable array means is programmed to store, read and erase the algorithm.

4. The self-checking EEPAL of claim 1 wherein the programmable array means comprises a programmable array, a fixed array and an output register electrically connected in series such that data is inputted to the programmable array and outputted by the output register.

5. The self-checking EEPAL of claim 4 wherein the programmable array comprises programmable cell arranged in rows and columns and wherein the cells of a row are coupled together by a product term line and the cells of a column are coupled together by a select line such that a cell is addressable by activating a specific product term line and a specific select line.

6. The self-checking EEPAL of claim 5 wherein each of the programmable cells comprise an electrically erasable/programmable device, a selection device and a verification device electrically coupled together utilizing the select and product term lines, such that space requirements for the self-checking EEPAL in an integrated circuit are minimized.

7. The self-checking EEPAL of claim 5 wherein the error detection means comprises a tri-state error detection register electrically coupled to an error detection circuit.

8. The self-checking EEPAL of clam 7 wherein the tri-state error detection register is electrically coupled to the select lines of the programmable array such that the contents of each cell is effectively verified by the error detection means.

9. An improved electrically erasable/programmable array logic (EEPAL) capable of storing, erasing and performing algorithms comprising:
   an input register electrically coupled to a data bus;
   a programmable array electrically coupled to the input register;
   a fixed array electrically coupled to the programmable array;
   an output register electrically coupled to the fixed array and to the data bus, wherein the improvement comprises:
   error detection code storage means operably contained within the programmable array for storing a predetermined error detection code;
   cell verification means operably contained within the programmable array for verifying the algorithm stored within the programmable array;
   tri-state storage means electrically coupled to the error detection code storage means and the cell verification means for storing at least part of the algorithm to be verified; and
   error detection means electrically coupled to the tri-state storage means for verifying said at least part of the algorithm stored in the tri-state storage means;
   such that the EEPAL is capable of self-verifying the algorithm stored within the programmable array.

10. The improved EEPAL of claim 9 wherein the input register is a tri-state device such that the tri-state storage means is in an active state and the input register is in a high impedance state when the EEPAL is verifying the stored algorithm, and the input register is in an active state and the tri-state storage means is in a high impedance state when the EEPAL is storing, reading and erasing the algorithm.

11. The improved EEPAL of claim 9 wherein the error detection means tests the algorithm during programming by comparing the data stored in the tri-state storage means with the data still present in the input register, and the error detection means self-tests the integrity of the stored algorithm immediately after programming and selectively prior to execution by utilizing an internally calculated representation of the stored algorithm and the predetermined error detection code.

12. The improved EEPAL of claim 11 wherein the error detection means produces an error signal such that the EEPAL is completely erased.

13. The improved EEPAL of claim 9 wherein the programmable array is comprises of electrically erasable/programmable (EEP) cells arranged in columns and rows where the EEP cells of a row are electrically coupled to a product term line, the EEP cells of a column are electrically coupled to a select line and each of the EEP cell are connected to one product term line and one select line.

14. The improved EEPAL of claim 13 wherein the error detection code storage means comprises at least one row in the programmable array and is electrically isolated from the fixed array.

15. The improved EEPAL of claim 14 wherein a row of the algorithm is parallelly loaded from the programmable array into the tri-state storage means and then serially loaded into the error detection means.

16. The improved EEPAL of claim 13 wherein the cell verification means utilizes the existing product term line and select lien such that space requirements are minimized.

17. The improved EEPAL of claim 16 wherein the cell verification means comprises a metal-oxide-semiconductor transistor electrically coupled such that it is biased by the product term line.

18. A method for self-checking an algorithm stored in a programmable array logic (PAL) device, comprises the steps of:
 a) programmable the PAL with the algorithm and an error detection code;
 b) verifying the storage o the algorithm in comparison with the inputted algorithm during the program process;
 c) verifying the algorithm in comparison with the error detection code immediately after programming;
 d) verifying the algorithm in comparison with the error detection code prior to executing the algorithm; and
 e) generating an error signal for an error detected in any of the verifying steps.

19. The method of claim 18 further comprising the step of erasing the algorithm and the error detection code from the programmable means whenever an error signal is generated.

* * * * *